(12) United States Patent
Tago et al.

(10) Patent No.: US 10,028,388 B2
(45) Date of Patent: Jul. 17, 2018

(54) COMPONENT-EMBEDDED SUBSTRATE

(71) Applicant: Murata Manufacturing Co., Ltd., Nagaokakyo-shi, Kyoto-fu (JP)

(72) Inventors: Shigeru Tago, Nagaokakyo (JP); Daisuke Tsuruga, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/430,869

(22) Filed: Feb. 13, 2017

(65) Prior Publication Data

US 2017/0156214 A1 Jun. 1, 2017

Related U.S. Application Data

(63) Continuation of application No. PCT/JP2015/073953, filed on Aug. 26, 2015.

(30) Foreign Application Priority Data

Sep. 4, 2014 (JP) ................. 2014-180354

(51) Int. Cl.
*H05K 1/00* (2006.01)
*H05K 1/18* (2006.01)
(Continued)

(52) U.S. Cl.
CPC ............ *H05K 1/185* (2013.01); *H05K 1/028* (2013.01); *H05K 1/115* (2013.01); *H05K 3/4644* (2013.01);
(Continued)

(58) Field of Classification Search
CPC ........ H05K 1/028; H05K 1/115; H05K 1/185; H05K 2201/0129; H05K 2201/05; H05K 2201/10515; H05K 3/4644
See application file for complete search history.

(56) References Cited

U.S. PATENT DOCUMENTS 9,743,526 B1 * 8/2017 Blackshear ............ H05K 1/185
2002/0076903 A1 6/2002 Kondo et al.
(Continued)

FOREIGN PATENT DOCUMENTS

JP 2002-164461 A 6/2002
JP 3407737 B2 5/2003
(Continued)

OTHER PUBLICATIONS

Official Communication issued in International Patent Application No. PCT/JP2015/073953, dated Dec. 1, 2015.

*Primary Examiner* — Yuriy Semenenko
(74) *Attorney, Agent, or Firm* — Keating & Bennett, LLP

(57) ABSTRACT

A component-embedded substrate includes first to sixth thermoplastic resin bases, a first electronic component in the second thermoplastic resin base and including a first terminal, and a second electronic component in the fifth thermoplastic resin base and including a second terminal. The first terminal faces the second electronic component in a stacking direction. The second terminal faces the first electronic component in the stacking direction. A first planar conductor to which the first terminal is directly bonded is provided on the third thermoplastic resin base. An interlayer connection conductor to which the second terminal is directly bonded and in communication with the first planar conductor is provided in or on the fourth thermoplastic resin base.

13 Claims, 6 Drawing Sheets

(51) Int. Cl.
*H05K 1/11* (2006.01)
*H05K 1/02* (2006.01)
*H05K 3/46* (2006.01)

(52) U.S. Cl.
CPC . *H05K 2201/0129* (2013.01); *H05K 2201/05* (2013.01); *H05K 2201/10515* (2013.01)

(56) References Cited

U.S. PATENT DOCUMENTS

| | | | |
|---|---|---|---|
| 2007/0178279 A1* | 8/2007 | Ogawa | H01L 23/5389 428/137 |
| 2009/0071705 A1* | 3/2009 | Kim | H01L 24/19 174/262 |
| 2010/0206621 A1* | 8/2010 | Wada | H05K 1/186 174/256 |
| 2010/0224992 A1* | 9/2010 | McConnelee | H01L 23/5383 257/723 |
| 2010/0282498 A1* | 11/2010 | Tezak | H05K 1/186 174/255 |
| 2012/0228005 A1* | 9/2012 | Chisaka | H05K 3/4691 174/250 |
| 2014/0000941 A1* | 1/2014 | Weidinger | H05K 1/185 174/252 |
| 2014/0226290 A1 | 8/2014 | Hayashi | |
| 2015/0163918 A1 | 6/2015 | Baba et al. | |

FOREIGN PATENT DOCUMENTS

| | | |
|---|---|---|
| JP | 2006-344631 A | 12/2006 |
| JP | 2009-272435 A | 11/2009 |
| JP | 2010-010537 A | 1/2010 |
| JP | 2012-147032 A | 8/2012 |
| JP | 2013-207194 A | 10/2013 |
| WO | 2014/069107 A1 | 5/2014 |

* cited by examiner

COMPONENT-EMBEDDED SUBSTRATE

CROSS REFERENCE TO RELATED APPLICATIONS

This application claims the benefit of priority to Japanese Patent Application No. 2014-180354 filed on Sep. 4, 2014 and is a Continuation Application of PCT Application No. PCT/JP2015/073953 filed on Aug. 26, 2015. The entire contents of each application are hereby incorporated herein by reference.

BACKGROUND OF THE INVENTION

1. Field of the Invention

The present invention relates to a component-embedded substrate in which electronic components are embedded.

2. Description of the Related Art

Multilayer substrates have been formed by stacking plural thermoplastic resin bases (see, for example, Japanese Patent No. 3407737).

In a multilayer substrate disclosed in Japanese Patent No. 3407737, planar conductors are provided on a surface of each thermoplastic resin base, the thermoplastic resin bases are stacked such that the surface of each base on which the planar conductors are formed faces the same direction, and the planar conductors that are provided on the respective bases are connected to each other by using interlayer connection conductors extending through the corresponding bases. Each of the interlayer connection conductors is formed in a manner in which a through-hole formed through the base is filled with a conductive paste, and the conductive paste is solidified during thermo-compression bonding. In some existing multilayer substrates, as disclosed in Japanese Patent No. 3407737, plural components are embedded therein.

FIG. 6 is a sectional side view of a component-embedded substrate 10P with an existing structure. The component-embedded substrate 10P includes a multilayer body 11P and electronic components 21P and 22P. The multilayer body 11P includes bases 111P, 112P, 113P, 114P, 115P, and 116P having thermoplastic and insulation properties. The bases 113P to 116P each have a main surface on which a planar conductor is formed and a surface opposite to the main surface, on which no planar conductor is formed. The bases 113P to 116P are stacked such that each main surface faces the same direction.

The electronic component 21P is embedded in the base 112P. The electronic component 21P includes terminals 211P and 212P and is disposed such that the terminals 211P and 212P face the base 111P (on the upper surface side). The electronic component 22P is embedded in the base 115P. The electronic component 22P includes terminals 221P and 222P and is disposed such that the terminals 221P and 222P face the base 114P (on the upper surface side).

A planar conductor 341P that is connected to and shared by the electronic component 21P and the electronic component 22P is disposed on a surface (upper surface) of the base 114P. The planar conductor 341P and a planar conductor 342P are disposed on the base 114P, and an interlayer connection conductor 441P and an interlayer connection conductor 442P are formed in the base 114P. A planar conductor 331P is disposed on the base 113P, and an interlayer connection conductor 431P is formed in the base 113P. A planar conductor 321P is disposed on the base 112P, and an interlayer connection conductor 421P is formed in the base 112P. A planar conductor 311P and a planar conductor 312P are disposed on the base 111P, and an interlayer connection conductor 411P, an interlayer connection conductor 412P, and an interlayer connection conductor 413P are formed in the base 111P.

In the component-embedded substrate 10P, the electronic component 22P is connected to the planar conductor 341P, which is connected to and shared by the electronic component 21P and the electronic component 22P, with only the interlayer connection conductor 441P interposed therebetween. The electronic component 21P is connected to the shared planar conductor 341P with a larger number of the planar conductors and interlayer connection conductors interposed therebetween, that is, with the interlayer connection conductor 411P, the planar conductor 311P, the interlayer connection conductor 413P, the planar conductor 321P, the interlayer connection conductor 421P, the planar conductor 331P, and the interlayer connection conductor 431P interposed therebetween.

Thus, in some existing component-embedded substrates in which plural electronic components are embedded, wiring formed of a planar conductor and an interlayer connection conductor that are connected to an electronic component is too long, and the loss of transmission to the electronic component greatly increases.

SUMMARY OF THE INVENTION

Preferred embodiments of the present invention decrease loss of transmission due to a planar conductor and an interlayer connection conductor that are connected to electronic components embedded in a component-embedded substrate.

A component-embedded substrate according to a preferred embodiment of the present invention includes a multilayer body including a plurality of thermoplastic resin bases stacked in a stacking direction and including a thermoplastic resin base including a surface that is clad with a copper layer and that include no thermoplastic resin base including two surfaces that are clad with copper layers, a first component that is disposed inside the multilayer body and that includes a first terminal, a second component that is disposed inside the multilayer body at a position away from the first component in the stacking direction and that includes a second terminal, and a wiring portion that is disposed inside the multilayer body and that is connected to the first terminal and the second terminal. The first component is disposed such that the first terminal faces the second component in the stacking direction. The second component is disposed such that the second terminal faces the first component in the stacking direction. The wiring portion includes a first planar conductor bonded directly to the first terminal by ultrasonic bonding and a first interlayer connection conductor that is bonded directly to the second terminal and that is in communication with the first planar conductor.

In a component-embedded substrate according to a preferred embodiment of the present invention, a first thermoplastic resin base and a second thermoplastic resin base that are included in the plurality of thermoplastic resin bases are preferably disposed between the first terminal and the second terminal in the stacking direction, and the surface of the first thermoplastic resin base that is clad with the copper layer is preferably located on the same side with respect to the first thermoplastic resin base as the surface of the second thermoplastic resin base that is clad with the copper layer is located with respect to the second thermoplastic resin base.

In a component-embedded substrate according to a preferred embodiment of the present invention, the first terminal is preferably welded to the first planar conductor.

With the above structure, the interval between the first terminal and the second terminal in the stacking direction of the multilayer body may be narrower than the interval in the case of an existing component-embedded substrate. Accordingly, the length of the wiring portion in communication with the first terminal and the second terminal is able to decreased.

The first planar conductor is preferably disposed between the first component and the second component in the stacking direction.

With this structure, the length of the wiring portion can be further decreased.

The first component preferably includes a plurality of terminals including the first terminal. The second component preferably includes a plurality of terminals including the second terminal. The interval between the terminals of the first component is preferably narrower than the interval between the terminals of the second component.

In the case where one of the terminals of a component is connected to a planar conductor by using a typical bonding method such as soldering, there is a risk of a short circuit due to the wettability or spread of the bonding material, and accordingly, it is necessary for the terminals of the component to be disposed at a relatively wide interval. In the case where one of terminals of a component is connected to an interlayer connection conductor, the terminals of the component may be disposed at a relatively narrow interval. For this reason, the interval between terminals, one of which is connected to a planar conductor is typically wider than the interval between terminals, one of which is connected to an interlayer connection conductor. However, in the case where one of the terminals of the first component is bonded to the planar conductor of the first thermoplastic resin base by ultrasonic bonding, the interval between the terminals of the first component is able to be relatively narrow. Accordingly, the first component and the second component each may be a component in which terminals are disposed at a narrow interval, such as an IC component. In addition, the interval between the terminals of the first component is able to be narrower than the interval between the terminals of the second component.

The first interlayer connection conductor may be bonded directly to the first planar conductor.

With this structure, the length of the wiring portion is further decreased.

According to various preferred embodiments of the present invention, component-embedded substrates with a low loss of transmission to the embedded electronic components are provided.

The above and other elements, features, steps, characteristics and advantages of the present invention will become more apparent from the following detailed description of the preferred embodiments with reference to the attached drawings.

DESCRIPTION OF THE PREFERRED EMBODIMENTS

First Preferred Embodiment

Figure 1:
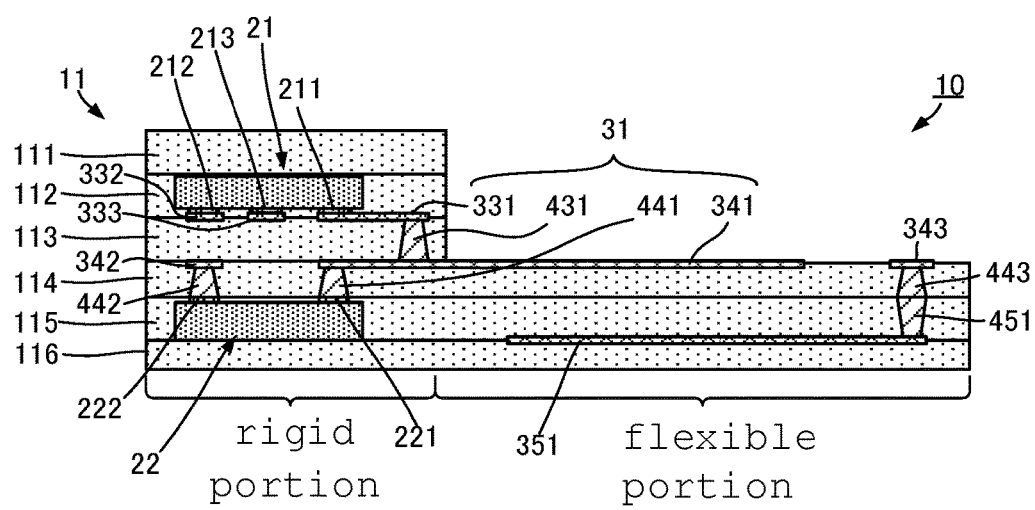
FIG. 1 is a sectional side view of a component-embedded substrate according to a first preferred embodiment of the present invention illustrating its structure.

A component-embedded substrate 10 according to a first preferred embodiment of the present invention will hereinafter be described. FIG. 1 is a sectional side view of the component-embedded substrate 10 illustrating its structure.

The component-embedded substrate 10 includes a multilayer body 11, an electronic component 21, an electronic component 22, planar conductors 331, 332, 333, 341, 342, 343, and 351, and interlayer connection conductors 431, 441, 442, 443, and 451.

The multilayer body 11 is formed preferably by stacking thermoplastic resin bases 111 to 116 such that their thickness direction coincides with a stacking direction. The thermoplastic resin base 111, the thermoplastic resin base 112, the thermoplastic resin base 113, the thermoplastic resin base 114, the thermoplastic resin base 115, and the thermoplastic resin base 116 are stacked in this order on the multilayer body 11. Of both surfaces of the multilayer body 11 in the stacking direction, the surface on the side of the thermoplastic resin base 111 is referred to as an "upper surface" below, and the surface on the side of the thermoplastic resin base 116 is referred to as a "bottom surface" below. The thermoplastic resin bases 111 to 116 are each made of a membranous thermoplastic resin. The thermoplastic resin is made of a material whose main component is, for example, a liquid crystal polymer.

The thermoplastic resin bases 111 to 113 are molded so as to have the same shape or substantially the same shape in a plan view. Also, the thermoplastic resin bases 114 to 116 are molded so as to have the same shape or substantially the same shape in a plan view. The thermoplastic resin bases 114 to 116 are molded so as to have an area larger than the area of the thermoplastic resin bases 111 to 113 in a plan view. Accordingly, the thickness of the multilayer body 11 at a portion at which the thermoplastic resin bases 111 to 116 are stacked differs from the thickness at a portion at which only the thermoplastic resin bases 114 to 116 are stacked. The portion at which the thermoplastic resin bases 111 to 116 are stacked is not flexible. That is, the portion at which the thermoplastic resin bases 111 to 116 are stacked is a rigid portion of the component-embedded substrate 10. The portion at which only the thermoplastic resin bases 114 to 116 are stacked is flexible. That is, the portion at which only the thermoplastic resin bases 114 to 116 are stacked is a flexible portion of the component-embedded substrate 10.

The thermoplastic resin bases 113 to 115 are each made of a thermoplastic resin sheet whose a surface is clad with a copper layer, and planar conductors are provided on only the surface of both surfaces thereof. That is, the thermoplastic resin bases 113 to 115 are not made of a thermoplastic resin sheet whose both surfaces are clad with copper layers. The surface of each of the thermoplastic resin bases 113 to 115 on which the corresponding planar conductor or planar conductors are provided is referred to as a "main surface". The surface of each of the thermoplastic resin bases 113 to 115 on which no planar conductors are provided is referred to as a "non-formation surface".

Both surfaces of the thermoplastic resin base 116 are non-formation surfaces, on which no conductors are provided. That is, assuming that the bottom surface of the thermoplastic resin base 116 is regarded as the main surface of the thermoplastic resin base 116, no planar conductors are provided on the non-formation surface of the thermoplastic resin base 116 that is opposite to the main surface nor on the main surface.

The surface of the thermoplastic resin base 115 on the side of the thermoplastic resin base 116 (bottom surface side) is a main surface, and the surface of the thermoplastic resin base 115 on the side of the thermoplastic resin base 114 (upper surface side) is a non-formation surface. The planar conductor 351 is provided on the main surface of the thermoplastic resin base 115, that is, at the boundary between the thermoplastic resin base 115 and the thermoplastic resin base 116. The planar conductor 351 is disposed inside the flexible portion of the multilayer body 11.

The interlayer connection conductor 451 is provided in the thermoplastic resin base 115 so as to extend from the main surface to the non-formation surface. The interlayer connection conductor 451 is connected to the planar conductor 351 on the main surface of the thermoplastic resin base 115, that is, at the boundary between the thermoplastic resin base 115 and the thermoplastic resin base 116.

The surface of the thermoplastic resin base 114 on the side of the thermoplastic resin base 113 (upper surface side) is a main surface, and the surface of the thermoplastic resin base 114 on the side of the thermoplastic resin base 115 (bottom surface side) is a non-formation surface. The planar conductors 341, 342, and 343 are provided on the main surface of the thermoplastic resin base 114, that is, at the boundary between the thermoplastic resin base 113 and the thermoplastic resin base 114. One portion of the planar conductor 341 and one portion of the planar conductor 342 are disposed inside the rigid portion of the multilayer body 11. The other portion of the planar conductor 341 and the other portion of the planar conductor 343 are disposed on a surface of the flexible portion of the multilayer body 11. The one portion of the planar conductor 341 is a land conductor for the electronic component 22, described later. The other portion of the planar conductor 341 is a land conductor for an external connection that connects the component-embedded substrate 10 to a surface-mount-type circuit element or a circuit substrate on the outside. The planar conductor 342 is a land conductor for the electronic component 22. The planar conductor 343 is a land conductor for an external connection that connects the component-embedded substrate 10 to a surface-mount-type circuit element or a circuit substrate on the outside.

The interlayer connection conductors 441, 442, and 443 are provided in or on the thermoplastic resin base 114 so as to extend from the main surface to the non-formation surface. The interlayer connection conductor 441 is connected to the planar conductor 341 on the main surface of the thermoplastic resin base 114, that is, at the boundary between the thermoplastic resin base 113 and the thermoplastic resin base 114. The interlayer connection conductor 442 is connected to the planar conductor 342 on the main surface of the thermoplastic resin base 114, that is, at the boundary between the thermoplastic resin base 113 and the thermoplastic resin base 114. The interlayer connection conductor 443 is connected to the planar conductor 343 on the main surface of the thermoplastic resin base 114, that is, on a plane along the boundary between the thermoplastic resin base 113 and the thermoplastic resin base 114.

The interlayer connection conductor 441 is connected to a terminal 221 of the electronic component 22, which is described later, on the non-formation surface of the thermoplastic resin base 114, that is, at the boundary between the thermoplastic resin base 114 and the thermoplastic resin base 115. The interlayer connection conductor 442 is connected to a terminal 222 of the electronic component 22, which is described later, on the non-formation surface of the thermoplastic resin base 114, that is, at the boundary between the thermoplastic resin base 114 and the thermoplastic resin base 115. The interlayer connection conductor 443 is connected to the interlayer connection conductor 451 provided in or on the thermoplastic resin base 115 on the non-formation surface of the thermoplastic resin base 114, that is, at the boundary between the thermoplastic resin base 114 and the thermoplastic resin base 115.

The surface of the thermoplastic resin base 113 on the side of the thermoplastic resin base 112 (upper surface side) is a main surface, and the surface of the thermoplastic resin base 113 on the side of the thermoplastic resin base 114 (bottom surface side) is a non-formation surface. The planar conductors 331, 332, and 333 are disposed on the main surface of the thermoplastic resin base 113, that is, at the boundary between the thermoplastic resin base 113 and the thermoplastic resin base 112. The planar conductors 331, 332, and 333 are disposed inside the rigid portion of the multilayer body 11. The planar conductors 331, 332, and 333 are land conductors for the electronic component 21, described later.

The interlayer connection conductor 431 is provided in or on the thermoplastic resin base 113 so as to extend from the main surface to the non-formation surface. The interlayer connection conductor 431 is connected to the planar conductor 331 on the main surface of the thermoplastic resin base 113, that is, at the boundary between the thermoplastic resin base 113 and the thermoplastic resin base 112. The interlayer connection conductor 431 is connected to the planar conductor 341 of the thermoplastic resin base 114 on the non-formation surface of the thermoplastic resin base 113, that is, at the boundary between the thermoplastic resin base 113 and the thermoplastic resin base 114.

Both surfaces of the thermoplastic resin base 112 are non-formation surfaces, on which no conductors are provided. That is, assuming that the upper surface of the thermoplastic resin base 112 is regarded as the main surface of the thermoplastic resin base 112, no planar conductors are provided on the non-formation surface of the thermoplastic resin base 112 that is opposite to the main surface nor on the main surface.

Both surfaces of the thermoplastic resin base 111 are non-formation surfaces, on which no conductors are provided. That is, assuming that the upper surface of the thermoplastic resin base 111 is regarded as the main surface of the thermoplastic resin base 111, no planar conductors are provided on the non-formation surface of the thermoplastic resin base 111 that is opposite to the main surface nor on the main surface.

In the multilayer body 11, the non-formation surface of the thermoplastic resin base 114 is in contact with the non-formation surface of the thermoplastic resin base 115. With this structure, the interval between the planar conductor 341 on the main surface of the thermoplastic resin base 114 and the planar conductor 351 on the main surface of the thermoplastic resin base 115 in the stacking direction differs from the interval in the case where the main surface of one of the thermoplastic resin bases is in contact with the non-formation surface of the other thermoplastic resin base, and for this purpose, it is not necessary to change the thickness of the thermoplastic resin base 114 nor the thickness of the thermoplastic resin base 115. In this way, electrical characteristics that are affected by the interval between the planar conductor 341 and the planar conductor 351 are adjusted.

Reversing the relationship between the main surface and the non-formation surface of the thermoplastic resin bases in the stacking direction in this way enables the planar conductors to be exposed from the upper surface and bottom surface of the multilayer body 11 in the stacking direction. Accordingly, a planar conductor on which a surface mount device is to be mounted and a planar conductor used to mount the multilayer body 11 on an external substrate can be formed on the upper surface and bottom surface of the multilayer body 11 at the same time.

In the component-embedded substrate 10, the planar conductor 331, the interlayer connection conductor 431, the interlayer connection conductor 441, and the planar conductor 341 are connected to each other and are connected directly to a terminal 211 of the electronic component 21 and the terminal 221 of the electronic component 22, which are described later, with no electronic components interposed therebetween. A combination of the planar conductor 331, the interlayer connection conductor 431, the interlayer connection conductor 441, and the planar conductor 341 is referred to as a "wiring portion" 31 below.

The electronic component 21 corresponds to a "first component". The electronic component 21 is embedded in the thermoplastic resin base 112 inside the rigid portion of the multilayer body 11 and includes the terminal 211 and terminals 212 and 213 on one side. The terminal 211 corresponds to a "first terminal". The terminals 211, 212, and 213 face the thermoplastic resin base 113 (on the bottom surface side) and are exposed from the surface of the thermoplastic resin base 112 at the boundary between the thermoplastic resin bases 112 and 113. The electronic component 22 is located in the direction of the thermoplastic resin base 113 (on the bottom surface side) when viewed from the electronic component 21, and accordingly, the terminals 211, 212, and 213 face the electronic component 22 (on the bottom surface side).

The electronic component 22 corresponds to a "second component". The electronic component 22 is embedded in the thermoplastic resin base 115 inside the rigid portion of the multilayer body 11 and includes the terminals 221 and 222 on one side. The terminal 221 corresponds to a "second terminal". The terminals 221 and 222 face the thermoplastic resin base 114 (on the upper surface side) and are exposed from the surface of the thermoplastic resin base 115 at the boundary between the thermoplastic resin bases 114 and 115. The electronic component 21 is located in the direction of the thermoplastic resin base 114 (on the upper surface side) when viewed from the electronic component 22, and accordingly, the terminals 221 and 222 face the electronic component 21 (on the upper surface side).

The thermoplastic resin base 113 adjacent to the electronic component 21 on the side opposite to the electronic component 22 has the main surface facing the electronic component 21 (on the upper surface side), and the planar conductor 331 is provided on the main surface. The terminal 211 overlaps the planar conductor 331 in a plan view of the multilayer body 11, and the planar conductor 331 and the terminal 211 are bonded directly to each other by ultrasonic bonding. That is, the planar conductor 331 corresponds to a "first planar conductor", and the terminal 211 is connected to the wiring portion 31 at the planar conductor 331. The planar conductors 332 and 333 are also provided on the main surface of the thermoplastic resin base 113, and the terminals 212 and 213 overlap the planar conductors 332 and 333 in a plan view of the multilayer body 11, respectively. That is, the terminals 212 and 213 are connected to the planar conductors 332 and 333, respectively.

The thermoplastic resin base 114 adjacent to the electronic component 22 on the side opposite to the electronic component 21 has the non-formation surface facing the electronic component 22 (on the bottom surface side), and the interlayer connection conductor 441 is provided in or on the thermoplastic resin base 114 so as to be exposed from the non-formation surface. The terminal 221 overlaps the interlayer connection conductor 441 in a plan view of the multilayer body 11, and the interlayer connection conductor 441 and the terminal 221 are bonded directly to each other. That is, the interlayer connection conductor 441 corresponds to a "first interlayer connection conductor", and the terminal 221 is connected to the wiring portion 31 at the interlayer connection conductor 441. The interlayer connection conductor 442 is also exposed from the non-formation surface of the thermoplastic resin base 114, and the terminal 222 overlaps the interlayer connection conductor 442 in a plan view of the multilayer body 11. That is, the terminal 222 is connected to the interlayer connection conductor 442.

With the above structure of the component-embedded substrate 10, the terminal 211 of the electronic component 21 faces the terminal 221 of the electronic component 22 in the stacking direction of the multilayer body 11 with only the thermoplastic resin bases 113 and 114 interposed therebetween, and the interval between the terminal 211 and the terminal 221 is narrower than the interval in the case of an existing component-embedded substrate. Accordingly, the wiring portion 31 is able to be connected to the terminal 211 and the terminal 221 with only the thermoplastic resin bases 113 and 114 interposed between the electronic component 21 and the electronic component 22. That is, the terminal 211 is able to be connected to the planar conductor 341 provided on the main surface of the thermoplastic resin base 114 in a state where only the planar conductor 331 provided on the main surface of the thermoplastic resin base 113 and the interlayer connection conductor 431 provided in or on the thermoplastic resin base 113 are interposed therebetween. The terminal 221 is able to be connected to the planar conductor 341 in a state where only the interlayer connection conductor 441 provided in or on the thermoplastic resin base 114 is interposed therebetween. Accordingly, the length of the wiring portion 31 connected to the terminal 211 and the terminal 221 is able to be decreased, and the loss of transmission of high-frequency signals to the electronic components 21 and 22 that occurs at the wiring portion 31 is able to be decreased.

Figure 6:
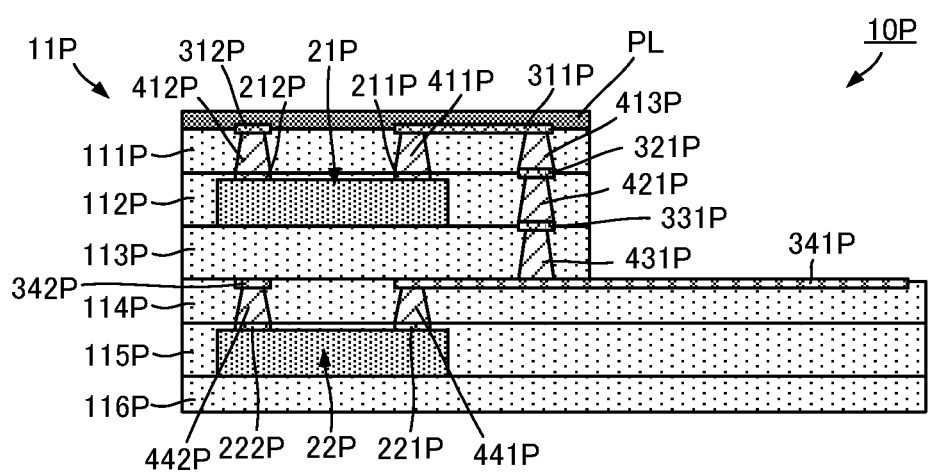
FIG. 6 is a sectional side view of a component-embedded substrate with an existing structure.

In addition, the planar conductor and the interlayer connection conductor that connect the electronic component 21 to the planar conductor 341 do not need to be disposed at a region of the rigid portion that differs from the region in which the electronic component 22 is disposed, unlike the component-embedded substrate 10P with an existing structure illustrated in FIG. 6. Accordingly, the area of the rigid portion is able to be decreased, and the size of the component-embedded substrate 10 according to the preferred embodiment is able to be decreased.

With the structure according to the present preferred embodiment, since the electronic component 21 overlaps the electronic component 22 in a plan view of the multilayer body 11, the area of the rigid portion is able to be further decreased.

With the structure according to the present preferred embodiment, since the terminal 211 of the electronic component 21 overlaps the terminal 221 of the electronic component 22, the loss of transmission of high-frequency signals at the wiring portion 31 is able to be further decreased.

With the structure according to the present preferred embodiment, the planar conductor 341 shared by and connected to the electronic component 21 and the electronic component 22 is also used as a planar conductor for a land to which the terminal 221 of the electronic component 22 is connected with the interlayer connection conductor 441 interposed therebetween. This also enables the loss of transmission of high-frequency signals to be further decreased.

With the structure according to the present preferred embodiment, only two layers of the thermoplastic resin bases are disposed between the electronic component 21 and the electronic component 22. Accordingly, the height (thickness) of the rigid portion is able to be decreased, and the height of the component-embedded substrate 10 is able to be decreased.

In the structure described in the present preferred embodiment, the thermoplastic resin bases 111 and 116, on which no conductors are provided, are disposed at uppermost and lowermost positions in the stacking direction. The thermoplastic resin bases 111 and 116 protect the electronic components 21 and 22 and a conductor pattern, and the thermoplastic resin bases 111 and 116 may be omitted.

A non-limiting example of a method of manufacturing the component-embedded substrate 10 according to a preferred embodiment of the present invention will now be described. FIGS. 2A-2D are sectional side views of the component-embedded substrate 10 illustrating its structure before thermo-compression bonding.

Figure 2A:
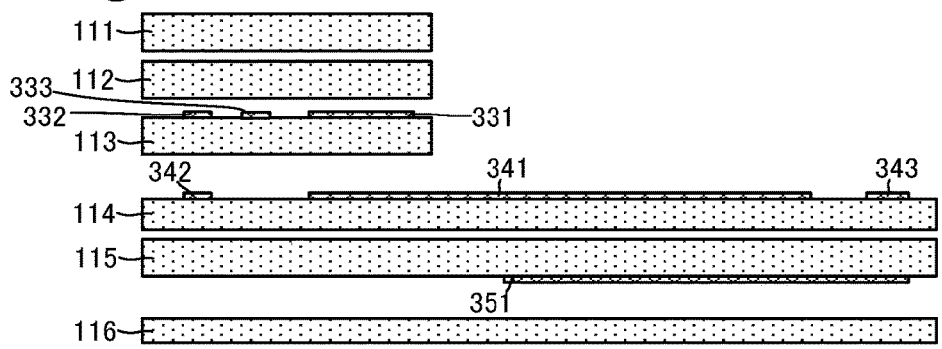
FIGS. 2A-2D are sectional side views of the component-embedded substrate according to the first preferred embodiment of the present invention illustrating its structure before thermo-compression bonding.

As illustrated in FIG. 2A, the manufacturing steps of the component-embedded substrate 10 begin with preparation of the thermoplastic resin bases 113, 114, and 115 whose a surface is clad with a copper layer and the thermoplastic resin bases 111, 112, and 116 having no copper layers. The planar conductors 331, 332, and 333 are defined by copper foils formed on the main surface of the thermoplastic resin base 113 through, for example, a patterning process. The planar conductors 341, 342, and 343 are defined by copper foils formed on the main surface of the thermoplastic resin base 114 through, for example, a patterning process. The planar conductor 351 is defined by a copper foil formed on the main surface of the thermoplastic resin base 115 through a patterning process.

Figure 2B:
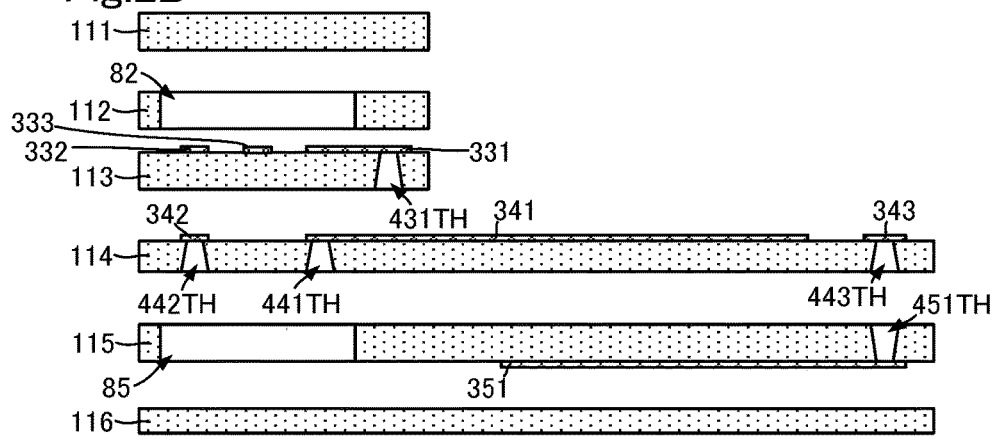

In a subsequent step, as illustrated in FIG. 2B, a hole 82 for inserting a component is formed through the thermoplastic resin base 112 so as to extend in the thickness direction of the thermoplastic resin base 112. A hole 85 for inserting a component is formed through the thermoplastic resin base 115 so as to extend in the thickness direction of the thermoplastic resin base 115. A through-hole 431TH extending through the thermoplastic resin base 113 from the non-formation surface is formed at a predetermined position of a portion of the thermoplastic resin base 113 at which the planar conductor 331 is formed. Through-holes 441TH, 442TH, and 443TH extending through the thermoplastic resin base 114 from the non-formation surface are formed at predetermined positions of portions of the thermoplastic resin base 114 at which the planar conductors 341, 342, and 343 are formed. A through-hole 451TH extending through the thermoplastic resin base 115 from the non-formation surface is formed at a predetermined position of a portion of the thermoplastic resin base 115 at which the planar conductor 351 is formed.

Figure 2C:
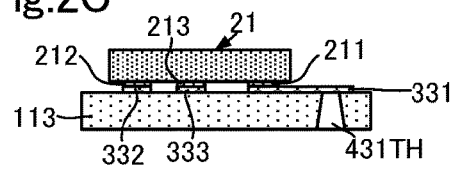

In a subsequent step, as illustrated in FIG. 2C, the electronic component 21 is placed on the main surface of the thermoplastic resin base 113 such that the terminals 211 and 212 are in contact with the planar conductors 331 and 332, respectively. The electronic component 21 is mounted on the main surface of the thermoplastic resin base 113 by an ultrasonic bonding method. Specifically, the electronic component 21 is ultrasonically vibrated to generate a frictional heat between the planar conductors 331, 332, and 333 and the terminals 211, 212, and 213, respectively. The frictional heat causes the terminals 211, 212, and 213 to be welded to the planar conductors 331, 332, and 333, respectively. Thus, the terminals 211, 212, and 213 of the electronic component 21 are bonded directly to the planar conductors 331, 332, and 333 on the thermoplastic resin base 113, respectively.

Figure 2D:
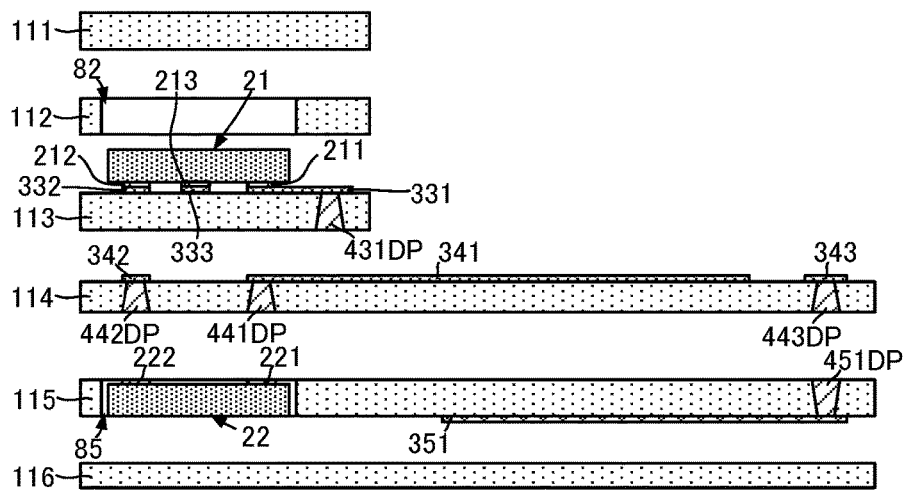

In a subsequent step, as illustrated in FIG. 2D, the through-hole 431TH, which is formed in the thermoplastic resin base 113 so as to overlap the planar conductor 331, is filled with a conductive paste 431DP. The through-holes 441TH, 442TH, and 443TH, which are formed in the thermoplastic resin base 114 so as to overlap the planar conductors 341, 342, and 343, are filled with conductive pastes 441DP, 442DP, and 443DP, respectively. The through-hole 451TH, which is formed in the thermoplastic resin base 115 so as to overlap the planar conductor 351, is filled with a conductive paste 451DP.

The planar conductors are disposed on one side of the through-holes formed through the thermoplastic resin bases. Accordingly, the planar conductors define and function as bottoms covering the through-holes against the conductive pastes having liquidity, and the conductive pastes are prevented from leaking from the through-holes. Accordingly, the manufacture of the component-embedded substrate 10 becomes easy, and the reliability of the interlayer connection conductors is improved.

The thermoplastic resin base 116 and the thermoplastic resin base 115 are stacked such that the main surface of the thermoplastic resin base 115 is in contact with the upper surface of the thermoplastic resin base 116. At this time, the electronic component 22 is inserted into the hole 85 of the thermoplastic resin base 115. The electronic component 22 is disposed such that the terminals 221 and 222 are located on the non-formation surface side, that is, the upper surface side of the thermoplastic resin base 115. The thermoplastic resin base 115 and the thermoplastic resin base 114 are stacked such that the non-formation surface of the thermoplastic resin base 114 is in contact with the non-formation surface of the thermoplastic resin base 115. The thermoplastic resin base 114 and the thermoplastic resin base 113 are stacked such that the non-formation surface of the thermoplastic resin base 113 is in contact with the main surface of the thermoplastic resin base 114. The thermoplastic resin base 113 and the thermoplastic resin base 112 are stacked such that the bottom surface of the thermoplastic resin base 112 is in contact with the main surface of the thermoplastic resin base 113. At this time, the electronic component 21 mounted on the main surface of the thermoplastic resin base 113 is inserted into the hole 82 of the thermoplastic resin base 112. The thermoplastic resin base 112 and the thermoplastic resin base 111 are stacked such that the bottom surface of the thermoplastic resin base 111 is in contact with the upper surface of the thermoplastic resin base 112.

The stacked thermoplastic resin bases 111 to 116 are heated at least while being pressurized in the stacking direction and are formed into an integrated, unitary piece. At this time, the conductive pastes 431DP, 441DP, 442DP, 443DP, and 451DP solidify to form the interlayer connection conductors 431, 441, 442, 443, and 451. At this time, the terminals 221 and 222 of the electronic component 22 are bonded directly to the interlayer connection conductors 441 and 442 of the thermoplastic resin base 114, respectively. The holes 82 and 85 are each filled with an insulating resin. Thus, the multilayer body 11 is realized.

The use of such a manufacturing method enables the component-embedded substrate 10 with a low loss of transmission to be readily manufactured. In the manufacturing method, an ultrasonic bonding method is used to bond the terminals 211, 212, and 213 directly to the planar conductors 331, 332, and 333 when the electronic component 21 is mounted on the main surface of the thermoplastic resin base 113, and the thermoplastic resin bases 111 to 116 are stacked and formed into an integrated, unitary piece after mounting. Accordingly, the electronic component 21 does not move in the hole 82 during, for example, stacking, and misalignment of the electronic component 21 is unlikely to occur. In addition, dripping of the bonding material does not occur in the ultrasonic bonding method unlike a bonding method that uses a paste or solder. Accordingly, a bonding failure and an unnecessary short-circuit due to re-melting do not occur even in the case of subsequently performing a heating process. Accordingly, the ultrasonic bonding method enables the position of the electronic component 21 mounted on the thermoplastic resin base 113 to be adjusted with high precision and enables the terminals to be disposed at a narrow interval as in the case of an IC component that is required to have high mounting precision. Accordingly, in the present preferred embodiment, the interval between the terminals 211, 212, and 213 of the electronic component 21 can be narrower than the interval between the terminals 221 and 222 of the electronic component 22.

First Modification

Figure 3:
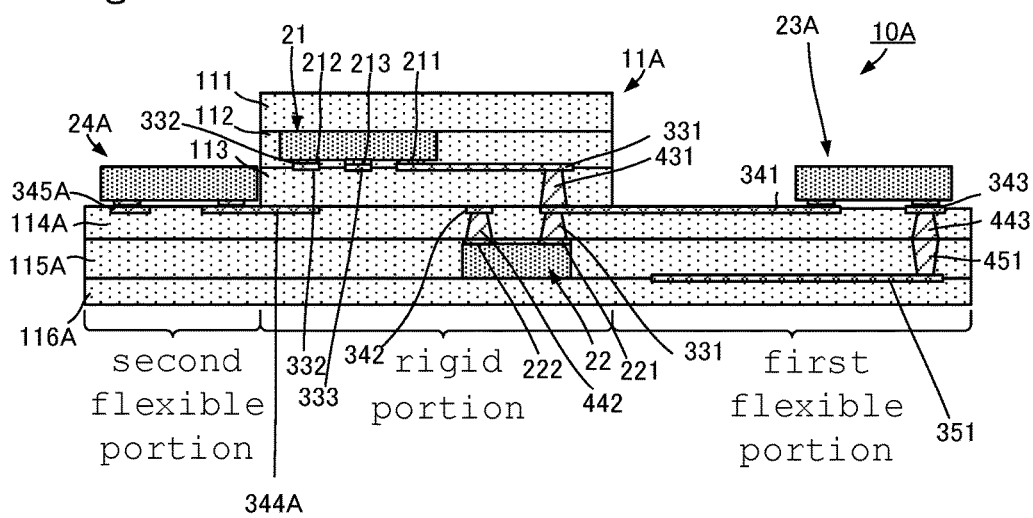
FIG. 3 is a sectional side view of a circuit module including a component-embedded substrate according to a modification of a preferred embodiment of the present invention.

A circuit module 10A and a component-embedded substrate 11A according to a first modification of the first preferred embodiment of the present invention will now be described. FIG. 3 is a sectional side view of the circuit module 10A and the component-embedded substrate 11A illustrating their structure.

The circuit module 10A includes the component-embedded substrate 11A and surface-mount-type connectors 23A and 24A.

The component-embedded substrate 11A includes thermoplastic resin bases 114A, 115A, and 116A, which define a structure different from the structure according to the first preferred embodiment. The flexible portion described in the first preferred embodiment is referred to as a first flexible portion here, and the length of the thermoplastic resin bases 114A, 115A, and 116A is longer than in the case of the first preferred embodiment so as to extend beyond both sides of the rigid portion, so that a second flexible portion is provided on the opposite side of the rigid portion from the first flexible portion.

The component-embedded substrate 11A includes planar conductors 344A and 345A, which are additional components to the first preferred embodiment. The planar conductors 344A and 345A are provided on the main surface (upper surface) of the thermoplastic resin base 114A so as to be exposed from the upper surface of the second flexible portion.

The connector 23A is mounted on the planar conductors 341 and 343 exposed from the upper surface of the first flexible portion. The connector 24A is mounted on the planar conductors 344A and 345A exposed from the upper surface of the second flexible portion.

The component-embedded substrate 11A according to the first modification of a preferred embodiment of the present invention may be formed in this way. With this structure, the circuit module 10A is able to be formed as a flat cable including matching circuits, for example, in a manner in which the electronic component 21 and the electronic component 22 are formed as matching circuits disposed on a wiring path between the connectors 23A and 24A.

The electronic component 21 and the electronic component 22 are spaced away from each other in the direction perpendicular or substantially perpendicular to the stacking direction and do not overlap in the stacking direction. Provided that the terminals of the electronic component 21 face the terminals of the electronic component 22, the electronic component 21 and the electronic component 22 may be disposed so as to overlap in the stacking direction or so as not to overlap in the stacking direction.

Second Preferred Embodiment

Figure 4:
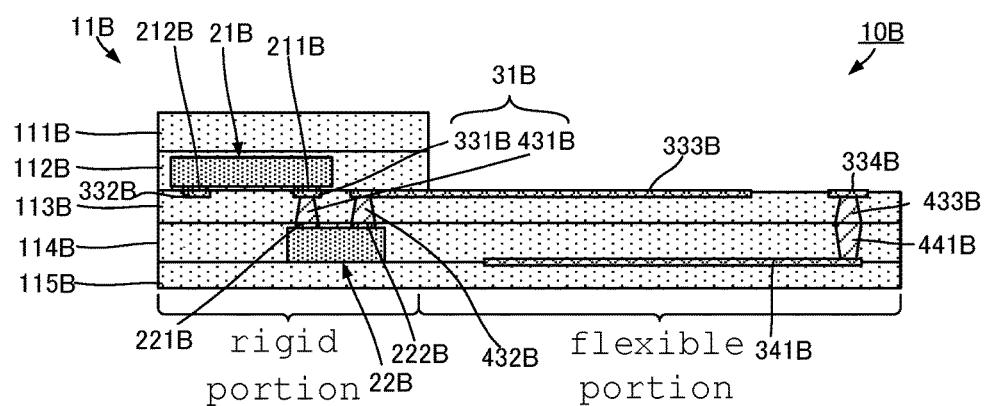
FIG. 4 is a sectional side view of a component-embedded substrate according to a second preferred embodiment of the present invention illustrating its structure.

A component-embedded substrate 10B according to a second preferred embodiment of the present invention will now be described. FIG. 4 is a sectional side view of the component-embedded substrate 10B illustrating its structure.

The component-embedded substrate 10B includes a multilayer body 11B, an electronic component 21B, an electronic component 22B, planar conductors 331B, 332B, 333B, 334B, and 341B, and interlayer connection conductors 431B, 432B, 433B, and 441B.

The multilayer body 11B is formed preferably by stacking a total of five thermoplastic resin bases 111B to 115B such that their thickness direction coincides with the stacking direction from the upper surface side to the bottom surface side. The multilayer body 11B includes a rigid portion in which the thermoplastic resin bases 111B to 115B are stacked and a flexible portion in which only the thermoplastic resin bases 113B to 115B are stacked.

The thermoplastic resin bases 113B and 114B are each made of a thermoplastic resin sheet whose a surface is clad with a copper layer and include a main surface and a non-formation surface.

Both surfaces of the thermoplastic resin base 115B are non-formation surfaces, on which no conductors are provided.

The surface of the thermoplastic resin base 114B on the side of the thermoplastic resin base 115B (bottom surface side) is the main surface, and the surface of the thermoplastic resin base 114B on the side of the thermoplastic resin base 113B (upper surface side) is the non-formation surface. The planar conductor 341B is provided on the main surface of the thermoplastic resin base 114B. The interlayer connection conductor 441B is provided in or on the thermoplastic resin base 114B so as to extend from the main surface to the non-formation surface. The interlayer connection conductor 441B is connected to the planar conductor 341B on the main surface of the thermoplastic resin base 114B.

The surface of the thermoplastic resin base 113B on the side of the thermoplastic resin base 112B (upper surface side) is the main surface, and the surface of the thermoplastic resin base 113B on the side of the thermoplastic resin base 114B (bottom surface side) is the non-formation surface. The planar conductors 331B, 332B, 333B, and 334B are provided on the main surface of the thermoplastic resin base 113B. The interlayer connection conductors 431B, 432B, and 433B are provided in or on the thermoplastic resin base 113B so as to extend from the main surface to the non-formation surface. The interlayer connection conductor 431B is connected to the planar conductor 331B on the main surface of the thermoplastic resin base 113B and is connected to a terminal 221B of the electronic component 22B, which is described later, on the non-formation surface of the thermoplastic resin base 113B. The interlayer connection conductor 432B is connected to the planar conductor 333B on the main surface of the thermoplastic resin base 113B and is connected to a terminal 222B of the electronic component 22B, which is described later, on the non-formation surface of the thermoplastic resin base 113B. The interlayer connection conductor 433B is connected to the planar conductor 334B on the main surface of the thermoplastic resin base 113B and is connected to the interlayer connection conductor 441B provided in or on the thermoplastic resin base 114B on the non-formation surface of the thermoplastic resin base 113B.

Both surfaces of the thermoplastic resin base 112B are non-formation surfaces, on which no conductors are provided.

Both surfaces of the thermoplastic resin base 111B are non-formation surfaces, on which no conductors are provided.

In the multilayer body 11B, the planar conductor 331B and the interlayer connection conductor 431B are connected to each other and are connected directly to a terminal 211B of the electronic component 21B, which is described later, and the terminal 221B of the electronic component 22B with no electronic components interposed therebetween. A combination of the planar conductor 331B and the interlayer connection conductor 431B is referred to as a "wiring portion" 31B below.

The electronic component 21B corresponds to the "first component". The electronic component 21B is embedded in the thermoplastic resin base 112B and includes the terminal 211B and a terminal 212B on one side. The terminal 211B corresponds to the "first terminal". The terminals 211B and 212B face the electronic component 22B (on the bottom surface side) and are exposed from the surface of the thermoplastic resin base 112B at the boundary between the thermoplastic resin bases 112B and 113B.

The electronic component 22B corresponds to the "second component". The electronic component 22B is embedded in the thermoplastic resin base 114B and includes the terminals 221B and 222B on one side. The terminal 221B corresponds to the "second terminal". The terminals 221B and 222B face the electronic component 21B (on the bottom surface side) and are exposed from the surface of the thermoplastic resin base 114B at the boundary between the thermoplastic resin bases 113B and 114B.

The thermoplastic resin base 113B adjacent to the electronic component 21B on the side opposite to the electronic component 22B has the main surface facing the electronic component 21B (on the upper surface side) and the non-formation surface facing the electronic component 22B (on the bottom surface side). The planar conductor 331B corresponds to the "first planar conductor" and is formed on the main surface of the thermoplastic resin base 113B. The interlayer connection conductor 431B corresponds to the "first interlayer connection conductor" and is formed in the thermoplastic resin base 113B so as to be exposed from the non-formation surface of the thermoplastic resin base 113B.

The terminal 211B overlaps the planar conductor 331B in a plan view of the multilayer body 11B, and the planar conductor 331B and the terminal 211B are bonded directly to each other. The terminal 221B overlaps the interlayer connection conductor 431B in a plan view of the multilayer body 11B, and the interlayer connection conductor 431B and the terminal 221B are bonded directly to each other.

With the above structure of the component-embedded substrate 10B, the terminal 211B of the electronic component 21B faces the terminal 221B of the electronic component 22B in the stacking direction of the multilayer body 11B with only the thermoplastic resin base 113B interposed therebetween, and the interval between the terminal 211B and the terminal 221B decreases. Accordingly, the wiring portion 31B is able to be connected to the terminal 211B and the terminal 221B with only the thermoplastic resin base 113B interposed between the electronic component 21B and the electronic component 22B. Accordingly, the length of the wiring portion 31B connected to the terminal 211B and the terminal 221B is able to be decreased, and the loss of transmission of high-frequency signals to the electronic components 21B and 22B that occurs at the wiring portion 31B is able to be decreased.

Figure 5A:
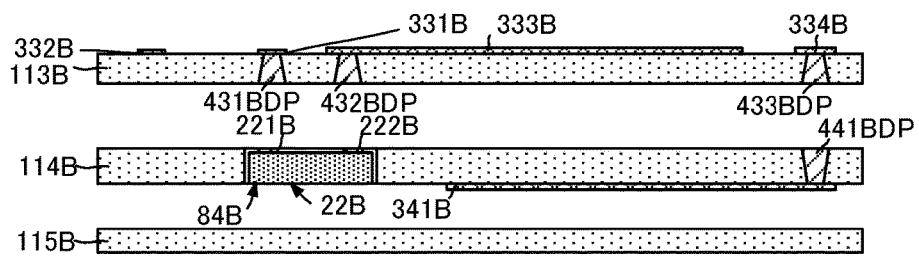
FIGS. 5A-5C are sectional side views of the component-embedded substrate according to the second preferred embodiment of the present invention illustrating its structure before thermo-compression bonding.
Figure 5B:
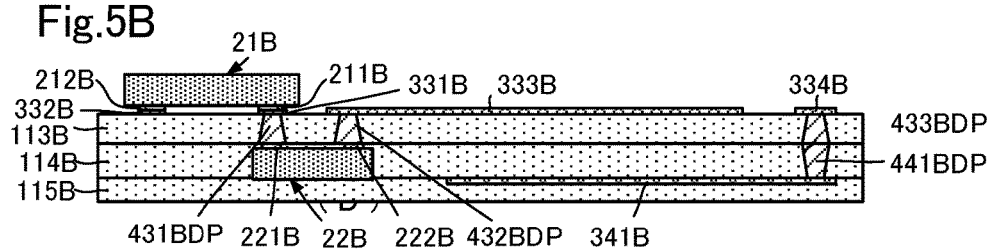
Figure 5C:
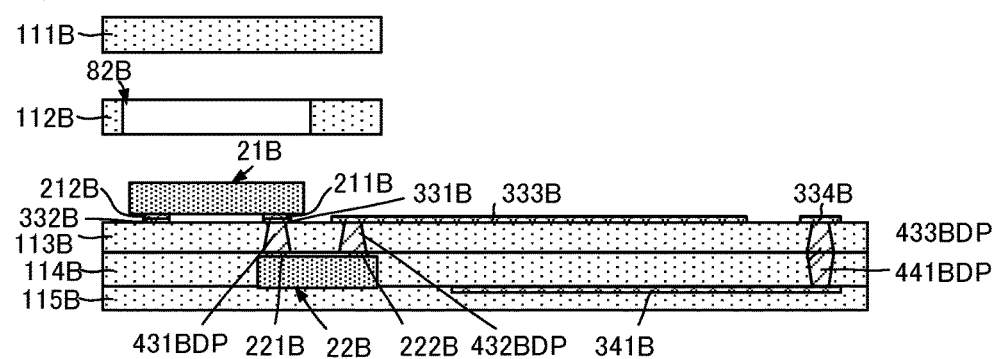

A non-limiting example of a method of manufacturing the component-embedded substrate 10B according to the second preferred embodiment will now be described. FIGS. 5A-5C are sectional side views of the component-embedded substrate 10B illustrating its structure before thermo-compression bonding.

As illustrated in FIG. 5A, the manufacturing steps of the component-embedded substrate 10B begin with preparation of the thermoplastic resin bases 113B and 114B whose a surface is clad with a copper layer and the thermoplastic resin base 115B having no copper layers. The planar conductors 331B, 332B, 333B, and 334B are defined by copper foils formed on the main surface of the thermoplastic resin base 113B through, for example, a patterning process. The planar conductor 341B is defined by a copper foil formed on the main surface of the thermoplastic resin base 114B through, for example, a patterning process. A hole 84B for inserting a component is formed through the thermoplastic resin base 114B so as to extend in the thickness direction of the thermoplastic resin base 114B. Through-holes extending through the thermoplastic resin base 113B from the non-formation surface are formed at predetermined positions of portions of the thermoplastic resin base 113B at which the planar conductors 331B, 333B, and 334B are formed. The through-holes are filled with conductive pastes 431BDP, 432BDP, and 433BDP. A through-hole extending through the thermoplastic resin base 114B from the non-formation surface is formed at a predetermined position of a portion of the thermoplastic resin base 114B at which the planar conductor 341B is formed. The through-hole is filled with a conductive paste 441BDP. The thermoplastic resin base 115B and the thermoplastic resin base 114B are stacked such that the main surface of the thermoplastic resin base 114B is in contact with the upper surface of the thermoplastic resin base 115B. At this time, the electronic component 22B is inserted into the hole 84B of the thermoplastic resin base 114B. The electronic component 22B is disposed such that the terminals 221B and 222B are located on the non-formation surface side, that is, the upper surface side of the thermoplastic resin base 114B. The thermoplastic resin base 114B and thermoplastic resin base 113B are stacked such that the non-formation surface of the thermoplastic resin base 113B is in contact with the non-formation surface of thermoplastic resin base 114B. The stacked thermoplastic resin bases 113B to 115B are heated at least while being pressurized in the stacking direction and are formed into an integrated piece. At this time, the conductive pastes 431BDP, 432BDP, 433BDP, and 441BDP solidify to form the interlayer connection conductors 431B, 432B, 433B, and 441B. At this time, the terminals 221B and 222B of the electronic component 22B are bonded directly to the interlayer connection conductors 431B and 432B of the thermoplastic resin base 113B, respectively.

In a subsequent step, as illustrated in FIG. 5B, the electronic component 21B is placed on the main surface of the thermoplastic resin base 113B such that the terminals 211B and 212B are in contact with the planar conductors 331B and 332B, respectively. The electronic component 21B is mounted on the main surface of the thermoplastic resin base 113B by an ultrasonic bonding method. Thus, the terminals 211B and 212B of the electronic component 21B are bonded directly to the planar conductors 331B and 332B of the thermoplastic resin base 113B, respectively.

In a subsequent step, as illustrated in FIG. 5C, the thermoplastic resin bases 111B and 112B having no copper layers are prepared. A hole 82B for inserting a component is formed through the thermoplastic resin base 112B so as to extend in the thickness direction of the thermoplastic resin base 112B. The thermoplastic resin base 113B and the thermoplastic resin base 112B are stacked such that the bottom surface of the thermoplastic resin base 112B is in contact with the main surface of the thermoplastic resin base 113B. At this time, the electronic component 21B mounted on the thermoplastic resin base 113B is inserted into the hole 82B of the thermoplastic resin base 112B. The thermoplastic resin base 112B and the thermoplastic resin base 111B are stacked such that the bottom surface of the thermoplastic resin base 111B is in contact with the upper surface of the thermoplastic resin base 112B. The stacked thermoplastic resin bases 111B to 115B are heated at least while being pressurized in the stacking direction and are formed into an integrated piece. Thus, the multilayer body 11B is realized.

The use of such a manufacturing method enables the component-embedded substrate 10B with a low loss of transmission to be readily manufactured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component-embedded substrate comprising:
   a multilayer body including a plurality of thermoplastic resin bases stacked in a stacking direction, the plurality of thermoplastic resin bases including a thermoplastic resin base with a surface that is clad with a copper layer and not including a thermoplastic resin base with two surfaces that are clad with copper layers;
   a first component that is disposed inside the multilayer body and that includes a first terminal;
   a second component that is disposed inside the multilayer body at a position away from the first component in the stacking direction and that includes a second terminal; and
   a wiring portion that is disposed inside the multilayer body and that is connected to the first terminal and the second terminal; wherein
   the first component is disposed such that the first terminal faces the second component in the stacking direction;
   the second component is disposed such that the second terminal faces the first component in the stacking direction;
   the wiring portion includes a first planar conductor ultrasonically bonded directly to the first terminal and a first interlayer connection conductor that is bonded directly to the second terminal and that is in communication with the first planar conductor;
   the first planar conductor is disposed between the first component and the second component in the stacking direction, and the first interlayer connection conductor is bonded directly to the first planar conductor; and
   the first planar conductor and the second terminal are connected only by the first interlayer connection conductor that is disposed in one of the thermoplastic resin bases.

2. The component-embedded substrate according to claim 1, wherein the first terminal is welded to the first planar conductor.

3. The component-embedded substrate according to claim 1, wherein
   the first component includes a plurality of terminals including the first terminal;
   the second component includes a plurality of terminals including the second terminal; and
   an interval between the terminals of the first component is narrower than an interval between the terminals of the second component.

4. The component-embedded substrate according to claim 1, wherein the multilayer body includes interlayer connection conductors extending through the plurality of thermoplastic resin bases.

5. The component-embedded substrate according to claim 1, wherein at least one of the plurality of thermoplastic resin bases does not have any conductors provided thereon.

6. The component-embedded substrate according to claim 1, wherein at least one adjacent pair of the plurality of thermoplastic resin bases do not have any conductors provided thereon defining non-formation surfaces that are in contact with each other.

7. The component-embedded substrate according to claim 1, wherein the first planar conductor is exposed from a surface of the multilayer body.

8. The component-embedded substrate according to claim 1, wherein the first component overlaps the second component as viewed in the stacking direction.

9. The component-embedded substrate according to claim 1, wherein first terminal overlaps the second terminal as viewed in the stacking direction.

10. The component-embedded substrate according to claim 1, wherein the first planar conductor is a planar conductor for a land to which the second terminal of the second electronic component is connected via the first interlayer connection conductor interposed therebetween.

11. The component-embedded substrate according to claim 1, wherein two of the plurality of thermoplastic resin bases without any conductors provided thereon are provided at uppermost and lowermost locations in the multilayer body.

12. The component-embedded substrate according to claim 1, further comprising additional planar conductors on a main surface of the multilayer body.

13. The component-embedded substrate according to claim 1, wherein the multilayer body includes a rigid portion and a flexible portion.

\* \* \* \* \*